United States Patent
Jang et al.

(10) Patent No.: US 6,438,441 B1
(45) Date of Patent: Aug. 20, 2002

(54) SEMICONDUCTOR FACTORY AUTOMATION SYSTEM AND METHOD FOR RESETTING PROCESS RECIPE BY EMPLOYING TRACE FILE

(75) Inventors: Bo-Soon Jang; Kil-Yong Noh; Hae-Sung Kim; Woo-Kyu Lee; Jong-Mo Ahn, all of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 161 days.

(21) Appl. No.: 09/605,644

(22) Filed: Jun. 28, 2000

(30) Foreign Application Priority Data

Jun. 28, 1999 (KR) ............................................. 99-24868
Jun. 28, 1999 (KR) ............................................. 99-24871

(51) Int. Cl.[7] .............................................. G06F 19/00
(52) U.S. Cl. ..................... 700/121; 700/96; 700/108; 700/115; 700/116; 700/117; 700/104; 438/5; 438/7; 438/10; 438/17
(58) Field of Search ............................ 700/95, 96, 108, 700/104, 115, 116, 117, 121, 17, 83; 438/14–15, 5–7, 17, 10, 599, 926; 118/724, 725, 728

(56) References Cited

U.S. PATENT DOCUMENTS

| | | |
|---|---|---|
| 4,571,685 A | 2/1986 | Kamoshida |
| 4,901,242 A | 2/1990 | Kotan |
| 5,111,404 A | 5/1992 | Kotani |
| 5,231,585 A | 7/1993 | Kobayashi et al. |
| 5,375,062 A | 12/1994 | Aoki |
| 5,402,349 A | 3/1995 | Fujita et al. |
| 5,440,493 A | 8/1995 | Doida |
| 5,461,570 A | 10/1995 | Wang et al. |
| 5,495,417 A | 2/1996 | Fuduka et al. |
| 5,541,846 A | 7/1996 | Secrest |
| 5,555,179 A | 9/1996 | Koyama et al. |
| 5,568,408 A | 10/1996 | Maeda |
| 5,579,231 A | 11/1996 | Sudou et al. |
| 5,591,299 A * | 1/1997 | Seaton et al. ................. 700/121 |
| 5,596,712 A | 1/1997 | Tsuyama et al. |
| 5,859,964 A * | 1/1999 | Wang et al. ..................... 714/48 |
| 5,886,896 A * | 3/1999 | Lantz et al. ................. 700/116 |
| 5,943,230 A * | 8/1999 | Rinnen et al. ............... 700/121 |
| 5,993,043 A | 11/1999 | Fujii |
| 6,035,293 A * | 3/2000 | Lantz et al. ..................... 707/1 |
| 6,041,270 A * | 3/2000 | Steffan et al. ............... 700/121 |
| 6,054,374 A * | 4/2000 | Gardner et al. ............. 438/528 |
| 6,092,000 A * | 7/2000 | Kuo et al. .................... 700/115 |
| 6,112,130 A * | 8/2000 | Fukuda et al. .............. 700/121 |
| 6,136,613 A * | 10/2000 | Lin et al. ......................... 438/4 |
| 6,197,604 B1 * | 3/2001 | Miller et al. ................... 438/14 |

FOREIGN PATENT DOCUMENTS

| | | | |
|---|---|---|---|
| EP | 0652539 A1 | 10/1994 | ............ G07C/3/00 |
| EP | 0932194 A1 | 12/1997 | ........... H01L/21/66 |
| WO | WO 00/36479 | 6/2000 | ......... G05B/19/418 |

\* cited by examiner

Primary Examiner—Ramesh Patel
(74) Attorney, Agent, or Firm—Jacobson Holman, PLLC

(57) ABSTRACT

A method for resetting a process recipe in a semiconductor factory automation (FA) system, includes the steps of: a) sending the process recipe and a lot identifier inputted from an operator to a process equipment, wherein the process recipe represents a set of semiconductor process conditions corresponding to a lot of semiconductor wafers and the lot identifier corresponds to the lot of semiconductor wafers; b) processing the lot of semiconductor wafers according to the process recipe; c) measuring the processed lot of semiconductor wafers to generate semiconductor measurement data; d) writing the semiconductor measurement data to a trace file, wherein the trace file includes the process recipe, the semiconductor measurement data and the lot identifier; e) retrieving the semiconductor measurement data contained in the trace file in response to a retrieval command inputted from the operator; and f) resetting the process recipe in response to a reset command inputted from the operator if the process recipe is not conformable, wherein the operator compares reference data with the retrieved semiconductor measurement data to determine whether the process recipe is conformable.

21 Claims, 5 Drawing Sheets

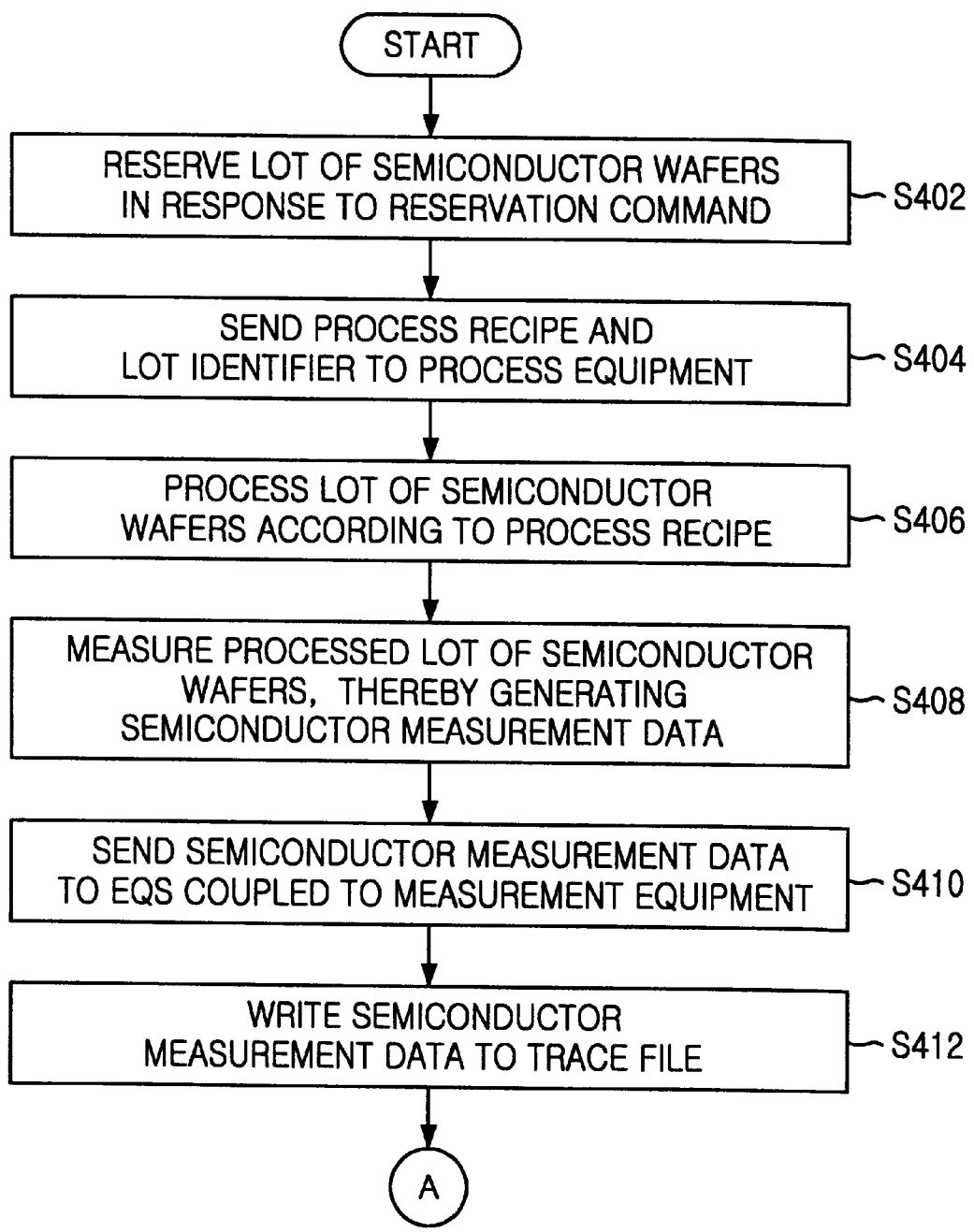

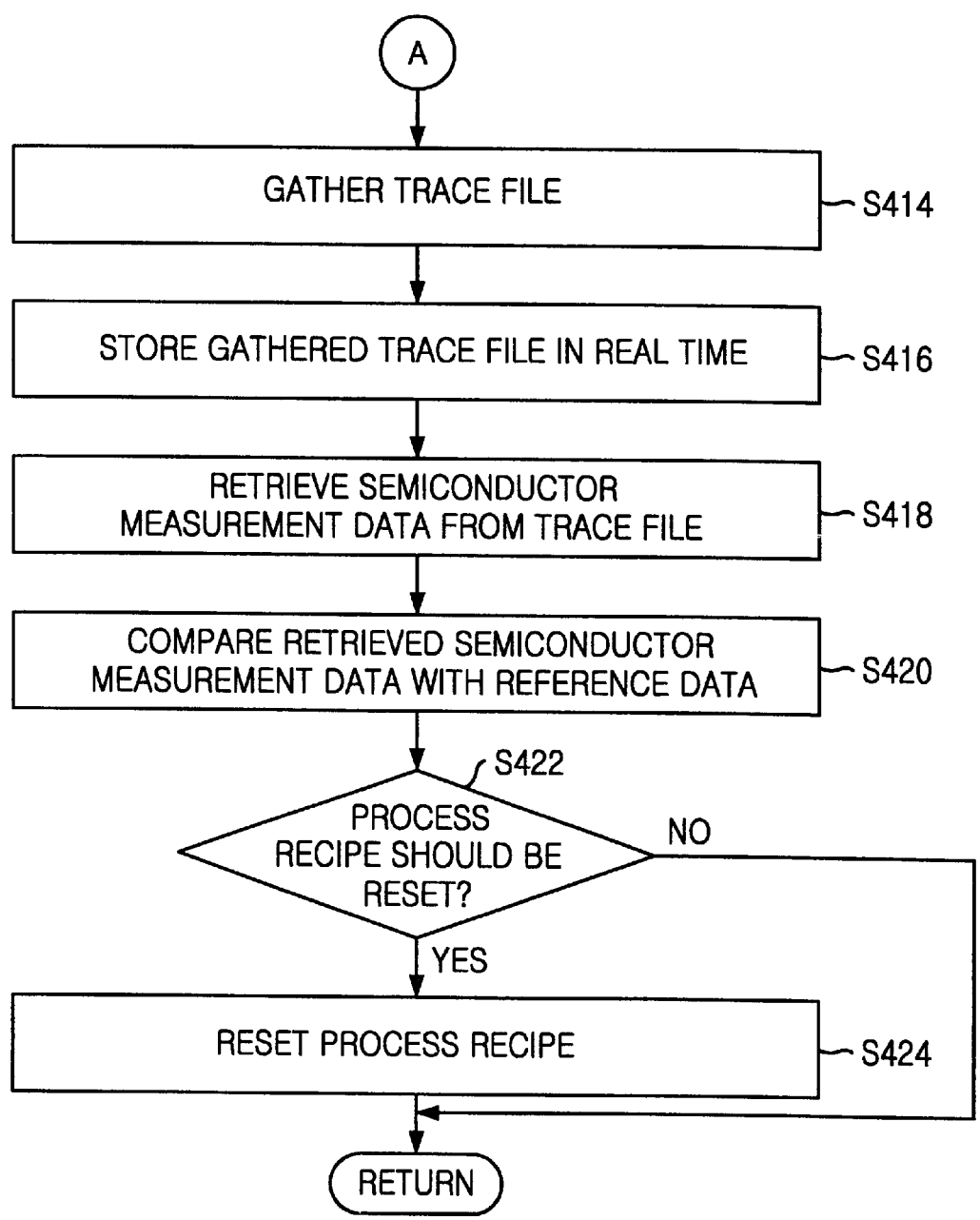

SEMICONDUCTOR FACTORY AUTOMATION SYSTEM AND METHOD FOR RESETTING PROCESS RECIPE BY EMPLOYING TRACE FILE

FIELD OF THE INVENTION

The present invention relates to a semiconductor factory automation (FA) system; and, more particularly, to a semiconductor FA system and method for resetting a process recipe by employing a trace file.

DESCRIPTION OF THE PRIOR ART

Generally, a conventional semiconductor FA system includes equipments (hereinafter, referred to as EQs) including measurement equipments and process equipments, stockers and an automatic guide vehicle (hereinafter, referred to as AGV). An EQ processes at least one lot of semiconductor wafers or measures at least one lot of semiconductor wafers processed. A stocker stocks a semiconductor wafer cassette containing at least one lot of semiconductor wafers to be processed or measured in the EQ. Further, the stocker stocks the semiconductor wafer cassette, which has been already processed or measured in the EQ.

The AGV transports the semiconductor wafer cassette from the EQ to another EQ. Further, the AGV transports the semiconductor wafer cassette from the stocker to the EQ. Furthermore, the AGV transports the semiconductor wafer cassette from the EQ to the stocker.

The conventional semiconductor FA system further an operator interface server (hereinafter, referred to as OIS). The OIS sends a process recipe directly inputted from an operator to the process equipment, wherein the process recipe represents a set of semiconductor process conditions corresponding to the lot of semiconductor wafers. The process equipment processes the lot of semiconductor wafers according to the process recipe. The measurement equipment measures the processed lot of semiconductor wafers, thereby generating semiconductor measurement data. An operator directly writes the semiconductor measurement data on a work sheet. The operator compares the semiconductor measurement data written on the work sheet with reference data to determine whether the process recipe is conformable. If the process recipe is not conformable, the operator should reset the process recipe on the basis of the semiconductor measurement data written on the work sheet. However, where the semiconductor measurement data increase, it is difficult for the operator to manage the semiconductor measurement data. Further, since it is difficult for the operator to manage the semiconductor process data and the semiconductor measurement data, there is a problem that the process recipe can not be accurately reset.

SUMMARY OF THE INVENTION

It is, therefore, an object of the present invention to provide a semiconductor FA system and method for resetting a process recipe by employing a trace file having semiconductor measurement data corresponding to a lot of semiconductor wafers measured in a measurement equipment.

In accordance with an aspect of the present invention, there is provided an apparatus for resetting a process recipe, comprising: a semiconductor processing means for processing at least one lot of semiconductor wafers according to the process recipe previously set, wherein the process recipe represents a set of semiconductor process conditions corresponding to the lot of semiconductor wafers; a semiconductor measuring means for measuring the processed lot of semiconductor wafers to generate semiconductor measurement data; a writing means for writing the semiconductor measurement data to a trace file, wherein the trace file includes the process recipe, the semiconductor measurement data and a lot identifier corresponding to the lot of semiconductor wafers; and an operator interface means for interfacing with an operator, said operator interface means including: a sending means for sending the process recipe and the lot identifier inputted from the operator to said semiconductor processing means; a retrieving means for retrieving the semiconductor measurement data contained in the trace file in response to a retrieval command inputted from the operator; and a resetting means for resetting the process recipe in response to a reset command inputted from the operator if the process recipe is not conformable, wherein the operator compares reference data with the retrieved semiconductor measurement data to determine whether the process recipe is conformable.

In accordance with another aspect of the present invention, there is provided a semiconductor factory automation (FA) system, comprising: a semiconductor processing means for processing at least one lot of semiconductor wafers according to a process recipe previously set, wherein the process recipe represents a set of semiconductor process conditions corresponding to the lot of semiconductor wafers; a semiconductor measuring means for measuring the processed lot of semiconductor wafers to generate semiconductor measurement data; a writing means for writing the semiconductor measurement data to a trace file, wherein the trace file includes the process recipe, the semiconductor measurement data and a lot identifier corresponding to the lot of semiconductor wafers; and an operator interface means for interfacing with an operator, said operator interface means including: a sending means for sending the process recipe and the lot identifier inputted from the operator to said semiconductor processing means; a retrieving means for retrieving the semiconductor measurement data contained in the trace file in response to a retrieval command inputted from the operator; and a resetting means for resetting the process recipe in response to a reset command inputted from the operator if the process recipe is not conformable, wherein the operator compares reference data with the retrieved semiconductor measurement data to determine whether the process recipe is conformable.

In accordance with further another aspect of the present invention, there is provided a method for resetting a process recipe in a semiconductor factory automation (FA) system, comprising the steps of: a) sending the process recipe previously set and a lot identifier inputted from an operator to a process equipment, wherein the process recipe represents a set of semiconductor process conditions corresponding to a lot of semiconductor wafers and the lot identifier corresponds to the lot of semiconductor wafers; b) processing the lot of semiconductor wafers according to the process recipe; c) measuring the processed lot of semiconductor wafers to generate semiconductor measurement data; d) writing the semiconductor measurement data to a trace file, wherein the trace file includes the process recipe, the semiconductor measurement data and the lot identifier; e) retrieving the semiconductor measurement data contained in the trace file in response to a retrieval command inputted from the operator; and f) resetting the process recipe in response to a reset command inputted from the operator if the process recipe is not conformable, wherein the operator compares reference data with the retrieved semiconductor measurement data to determine whether the process recipe is conformable.

BRIEF DESCRIPTION OF THE DRAWINGS

The above and other objects and features of the instant invention will become apparent from the following description of preferred embodiments taken in conjunction with the accompanying drawings, in which:

FIGS. 4 to 5 are flowcharts showing a method for resetting a process recipe by employing a trace file in accordance with the present invention.

DETAILED DESCRIPTION OF THE INVENTION

Figure 1:
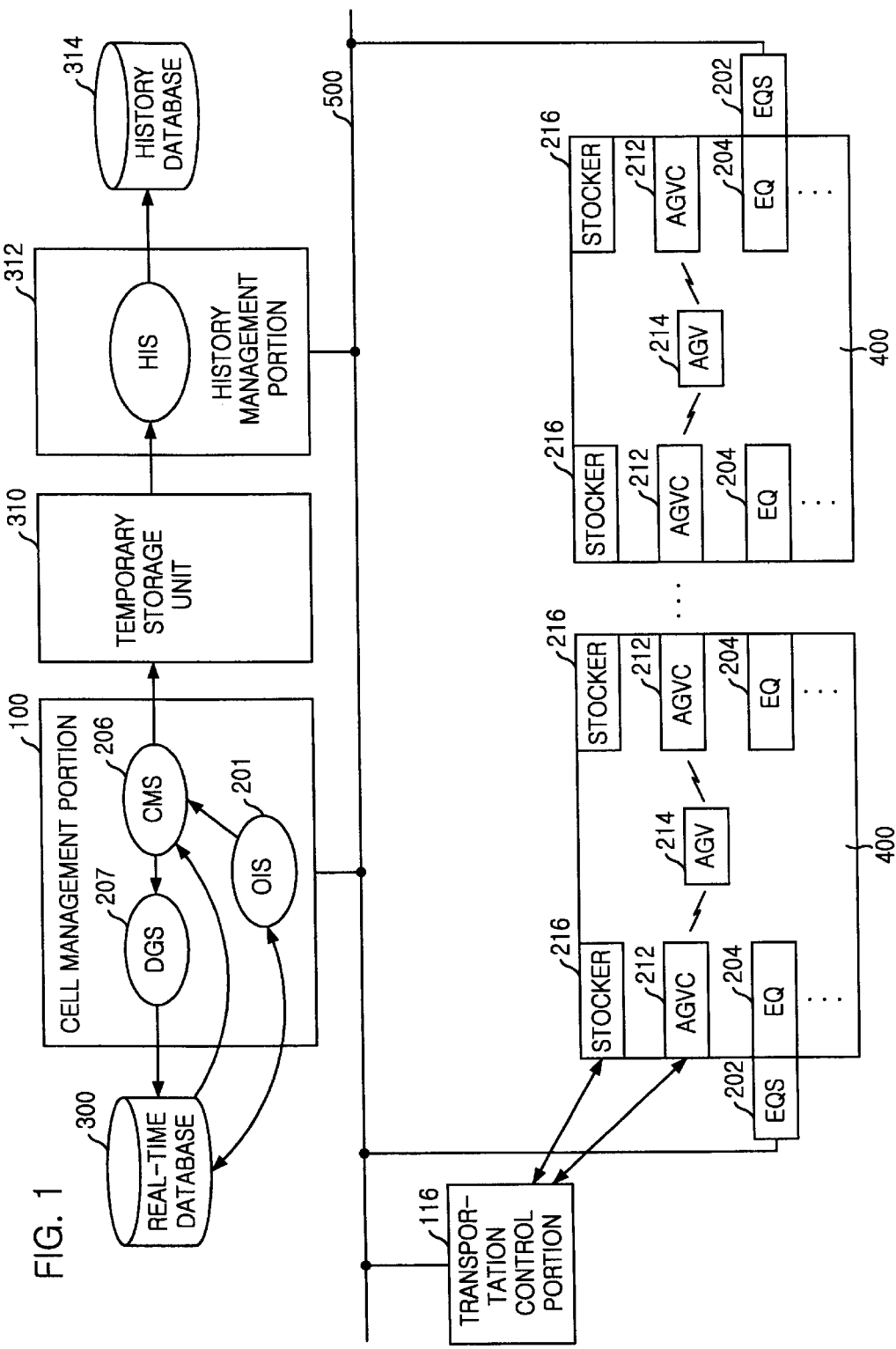
FIG. 1 is a block diagram describing a semiconductor FA system for resetting a process recipe by employing a trace file in accordance with the present invention.

Referring to FIG. 1, there is shown a block diagram showing a semiconductor factory automation (FA) system for resetting a process recipe by employing a trace file in accordance with the present invention. As shown, the semiconductor FA system includes at least one cell, which has a predetermined number, e.g., 4, of semiconductor production bays 400. A semiconductor production bay 400 is provided with equipments (EQs) 204 including measurement equipments and process equipments, stockers 216 and an automatic guide vehicle (AGV) 214. An EQ 204 as a process equipment processes semiconductor wafers in order to obtain semiconductor devices. The EQ 204 as a measurement equipment measures the processed semiconductor wafers.

The EQ 204 includes, e.g., an etching equipment, a photo-lithography equipment, a furnace equipment, an ellipsometer equipment, a stepper equipment, an overlay equipment and the like.

A stocker 216 temporarily stocks a number of semiconductor wafer cassettes. Each of semiconductor wafer cassettes has a predetermined number of semiconductor wafers, which is referred to as a lot. The semiconductor wafer cassettes are selectively transported to the EQ 204 by using the AGV 214. The semiconductor wafer cassette stocked in the stocker 216 is transported to another semiconductor production bay 400.

An equipment server (EQS) 202 is coupled to a common communication line 500, e.g., Ethernet™ supplied by Xerox Corporation. An AGV controller (AGVC) 212 controls the AGV 214.

The semiconductor FA system also includes a cell management portion 100, a real-time database 300 connected to the cell management portion 100, a temporary storage unit 310, a history management portion 312 connected to the temporary storage unit 310 and a history database 314 connected to the history management portion 312. The cell management portion 100 and the history management portion 312 are respectively connected to the common communication line 500 for communication therebetween.

The cell management portion 100 includes a cell management server (CMS) 206, an operator interface server (hereinafter, referred to as OIS) 201 and a data gathering server (hereinafter, referred to as DGS) 207. The DGS 207 stores semiconductor process data associated with the lot in the real-time database 300.

The EQ 204 as a process equipment processes at least one lot of semiconductor wafers according to a process recipe previously set, wherein the process recipe represents a set of semiconductor process conditions corresponding to the lot of semiconductor wafers. The EQ 204 as a measurement equipment measures the processed lot of semiconductor wafers to generate semiconductor measurement data. The EQS 202 coupled to the measurement equipment writes the semiconductor measurement data to a trace file, wherein the trace file includes the process recipe, the semiconductor measurement data and a lot identifier corresponding to the lot of semiconductor wafers. The OIS 201 interfaces with an operator.

Figure 3:
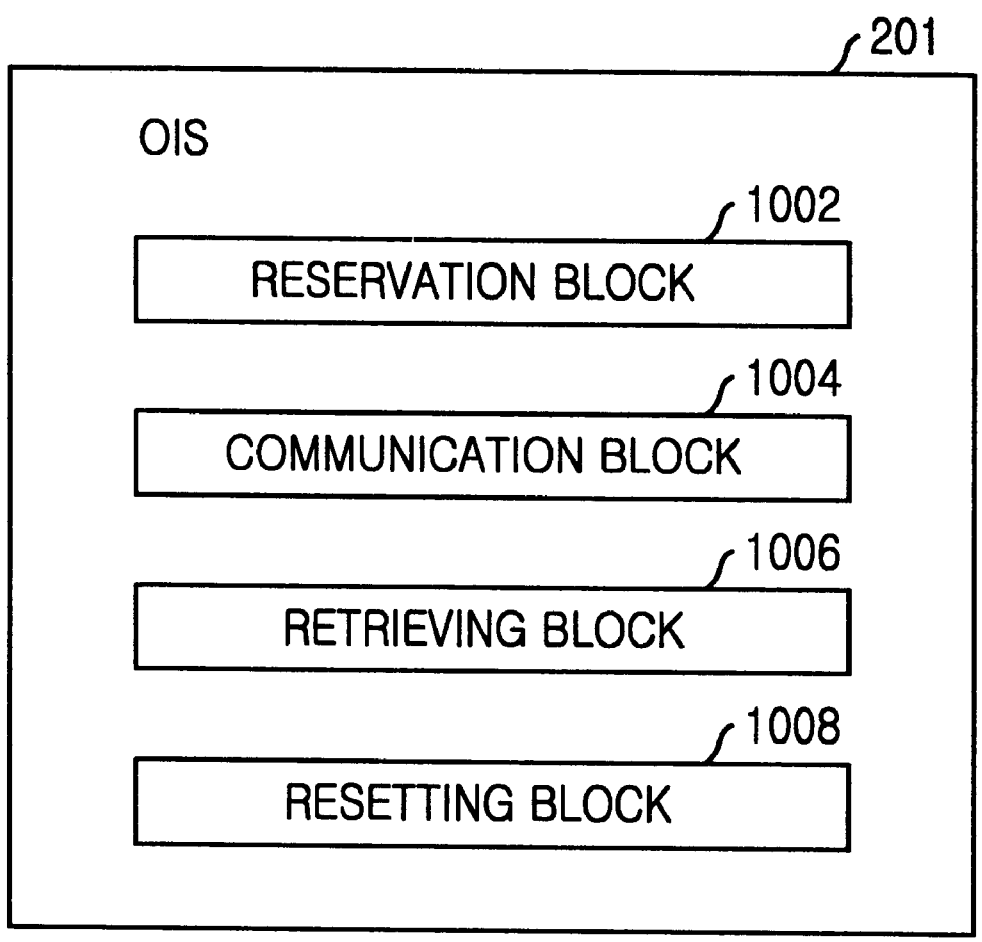
FIG. 3 is a block diagram depicting an operator interface server (OIS) shown FIG. 1.

As shown in FIG. 3, the OIS 201 includes a communication block 1004, a reservation block 1002, a retrieving block 1006 and a resetting block 1008. The communication block 1004 sends the process recipe and the lot identifier inputted from the operator to the process equipment. The retrieving block 1006 retrieves the semiconductor measurement data contained in the trace file in response to a retrieval command inputted from the operator. The resetting block 1008 resets the process recipe in response to a reset command inputted from the operator if the process recipe is not conformable, wherein the operator compares reference data with the retrieved semiconductor measurement data to determine whether the process recipe is conformable. The reservation block 1002 reserves the lot of semiconductor wafers in response to a reservation command inputted from the operator.

The DGS 207 gathers the trace file. The real-time database 300 stores the gathered trace file. The process equipment includes a stepper, which applies an exposure process to the lot of semiconductor wafers. The measurement equipment includes an overlay equipment.

Figure 2:
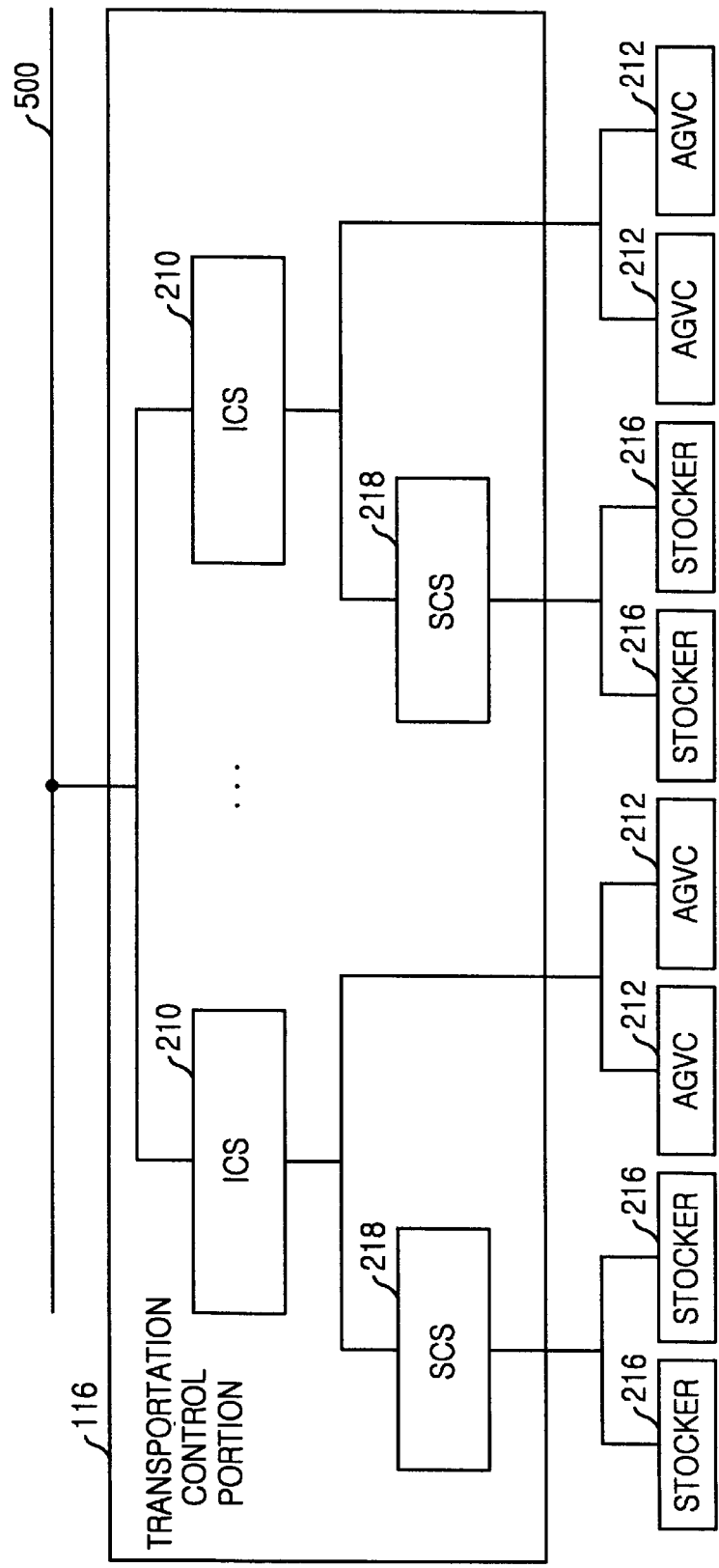
FIG. 2 is a block diagram illustrating a transportation control portion shown in FIG. 1.

Referring to FIG. 2, there is shown a block diagram illustrating a transportation control portion shown in FIG. 1. As shown, the transportation control portion 116 includes intrabay control servers (ICSs) 210 coupled to the common communication line 500 and stocker control servers (SCSs) 218. The ICS 210 converts a transportation message into a transportation command from the common communication line 500. The SCS 218 generates a stocker control command to control the stockers 216 in response to the transportation command. The AGVC 212 generates an AGV control command to control an AGV 214 in response to the transportation command.

Referring to FIGS. 4 to 5, there are flowcharts showing a method for resetting a process recipe by employing a trace file in accordance with the present invention.

Referring to FIG. 4, at step S402, the reservation block 1002 of the OIS 201 shown in FIG. 3 reserves a lot of semiconductor wafers in response to a reservation command inputted from an operator.

At step S404, the communication block 1004 of the OIS 201 shown in FIG. 3 sends a process recipe previously set and a lot identifier via the EQS 202 shown in FIG. 1 to a process equipment. The process recipe represents a set of semiconductor process conditions corresponding to the lot of semiconductor wafers.

At step S406, the process equipment processes the lot of semiconductor wafers according to the process recipe.

At step S408, a measurement equipment measures the processed lot of semiconductor wafers, thereby generating semiconductor measurement data.

At step S410, the measurement equipment sends the semiconductor measurement data to the EQS 202 coupled to the measurement equipment.

At step S412, the EQS 202 coupled to the measurement equipment writes the semiconductor measurement data to the trace file.

Referring to FIG. 5, at step S414, the DGS 207 shown in FIG. 1 gathers the trace file having the semiconductor measurement data.

At step S416, the real-time database 300 shown in FIG. 1 stores the gathered trace file in a real time.

At step S418, the retrieving block 1006 of the OIS 201 shown in FIG. 3 retrieves the semiconductor measurement data from the trace file stored in the real-time database 300 in response to a retrieval command inputted from the operator.

At step S420, the operator compares the retrieved semiconductor measurement data with reference data.

At step S422, the operator determines whether the process recipe should be reset.

At step S424, if the process recipe should be reset, the resetting block 1008 of the OIS 201 shown in FIG. 3 resets the process recipe in response to a reset command inputted from the operator.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for resetting a process recipe, comprising:
  a semiconductor processing means for processing at least one lot of semiconductor wafers according to the process recipe previously set, wherein the process recipe represents a set of semiconductor process conditions corresponding to the lot of semiconductor wafers;
  a semiconductor measuring means for measuring the processed lot of semiconductor wafers to generate semiconductor measurement data;
  a writing means for writing the semiconductor measurement data to a trace file, wherein the trace file includes the process recipe, the semiconductor measurement data and a lot identifier corresponding to the lot of semiconductor wafers; and
  an operator interface means for interfacing with an operator, said operator interface means including:
    a sending means for sending the process recipe and the lot identifier inputted from the operator to said semiconductor processing means;
    a retrieving means for retrieving the semiconductor measurement data contained in the trace file in response to a retrieval command inputted from the operator; and
    a resetting means for resetting the process recipe in response to a reset command inputted from the operator if the process recipe is not conformable, wherein the operator compares reference data with the retrieved semiconductor measurement data to determine whether the process recipe is conformable.

2. The apparatus as recited in claim 1, said operator interface means further includes:
  a reservation means for reserving the lot of semiconductor wafers in response to a reservation command inputted from the operator.

3. The apparatus as recited in claim 2, further comprising:
  a storage means for storing the trace file having the semiconductor measurement data, the process recipe and the lot identifier.

4. The apparatus as recited in claim 3, wherein said retrieving means retrieves the semiconductor measurement data contained in the trace file stored in said storage means.

5. The apparatus as recited in claim 4, wherein said storage means includes;
  a gathering means for gathering the trace file; and
  a real-time database for storing the gathered trace file.

6. The apparatus as recited in claim 5, wherein said semiconductor processing means includes a stepper, which applies an exposure process to the lot of semiconductor wafers.

7. The apparatus as recited in claim 6, wherein said semiconductor measuring means includes an overlay equipment.

8. A semiconductor factory automation (FA) system, comprising:
  a semiconductor processing means for processing at least one lot of semiconductor wafers according to a process recipe previously set, wherein the process recipe represents a set of semiconductor process conditions corresponding to the lot of semiconductor wafers;
  a semiconductor measuring means for measuring the processed lot of semiconductor wafers to generate semiconductor measurement data;
  a writing means for writing the semiconductor measurement data to a trace file, wherein the trace file includes the process recipe, the semiconductor measurement data and a lot identifier corresponding to the lot of semiconductor wafers; and
  an operator interface means for interfacing with an operator, said operator interface means including:
    a sending means for sending the process recipe and the lot identifier inputted from the operator to said semiconductor processing means;
    a retrieving means for retrieving the semiconductor measurement data contained in the trace file in response to a retrieval command inputted from the operator; and
    a resetting means for resetting the process recipe in response to a reset command inputted from the operator if the process recipe is not conformable, wherein the operator compares reference data with the retrieved semiconductor measurement data to determine whether the process recipe is conformable.

9. The semiconductor FA system as recited in claim 8, said operator interface means further includes:
  a reservation means for reserving the lot of semiconductor wafers in response to a reservation command inputted from the operator.

10. The semiconductor FA system as recited in claim 9, further comprising:
  a storage means for storing the trace file having the semiconductor measurement data, the process recipe and the lot identifier.

11. The semiconductor FA system as recited in claim 10, wherein said retrieving means retrieves the semiconductor measurement data contained in the trace file stored in said storage means.

12. The semiconductor FA system as recited in claim 11, wherein said storage means includes;
  a gathering means for gathering the trace file; and
  a real-time database for storing the gathered trace file.

13. The semiconductor FA system as recited in claim 12, wherein said semiconductor processing means includes a stepper, which applies an exposure process to the lot of semiconductor wafers.

14. The semiconductor FA system as recited in claim 13, wherein said semiconductor measuring means includes an overlay equipment.

15. The semiconductor FA system as recited in claim 14, further comprising:

a transportation means for transporting a semiconductor wafer cassette containing at least one lot of semiconductor wafers.

16. The semiconductor FA system as recited in claim 15, further comprising:

a stocking means for stocking the semiconductor wafer cassette transported by said transportation means.

17. A method for resetting a process recipe in a semiconductor factory automation (FA) system, comprising the steps of:

a) sending the process recipe previously set and a lot identifier inputted from an operator to a process equipment, wherein the process recipe represents a set of semiconductor process conditions corresponding to a lot of semiconductor wafers and the lot identifier corresponds to the lot of semiconductor wafers;

b) processing the lot of semiconductor wafers according to the process recipe;

c) measuring the processed lot of semiconductor wafers to generate semiconductor measurement data;

d) writing the semiconductor measurement data to a trace file, wherein the trace file includes the process recipe, the semiconductor measurement data and the lot identifier;

e) retrieving the semiconductor measurement data contained in the trace file in response to a retrieval command inputted from the operator; and f) resetting the process recipe in response to a reset command inputted from the operator if the process recipe is not conformable, wherein the operator compares reference data with the retrieved semiconductor measurement data to determine whether the process recipe is conformable.

18. The method as recited in claim 17, said step a) further includes the step of:

a1) reserving the lot of semiconductor wafers in response to a reservation command inputted from the operator.

19. The method as recited in claim 18, further comprising the step of:

g) storing the trace file having the semiconductor measurement data, the process recipe and the lot identifier.

20. The method as recited in claim 19, wherein said step g) includes the steps of;

g1) gathering the trace file; and g2) storing the gathered trace file in a real time.

21. The method as recited in claim 20, wherein said step b) includes the step of:

applying an exposure process to the lot of semiconductor wafers according to the process recipe.

* * * * *